United States Patent
Michel

(10) Patent No.: US 10,938,356 B2
(45) Date of Patent: Mar. 2, 2021

(54) INTEGRATION CIRCUIT AND METHOD FOR PROVIDING AN OUTPUT SIGNAL

(71) Applicant: ams International AG, Rapperswil (CH)

(72) Inventor: Fridolin Michel, Richterswil (CH)

(73) Assignee: AMS INTERNATIONAL AG, Rapperswil (CH)

( * ) Notice: Subject to any disclaimer, the term of this patent is extended or adjusted under 35 U.S.C. 154(b) by 25 days.

(21) Appl. No.: 16/332,856

(22) PCT Filed: Aug. 1, 2017

(86) PCT No.: PCT/EP2017/069423
§ 371 (c)(1),
(2) Date: Mar. 13, 2019

(87) PCT Pub. No.: WO2018/059796
PCT Pub. Date: Apr. 5, 2018

(65) Prior Publication Data
US 2019/0363682 A1  Nov. 28, 2019

(30) Foreign Application Priority Data

Sep. 27, 2016 (EP) ..................................... 16190888

(51) Int. Cl.
*H03F 3/00* (2006.01)
*H03F 3/45* (2006.01)

(52) U.S. Cl.
CPC ......... *H03F 3/005* (2013.01); *H03F 3/45475* (2013.01); *H03F 2200/264* (2013.01);
(Continued)

(58) Field of Classification Search
CPC ...................................................... H03F 3/005
See application file for complete search history.

(56) References Cited

U.S. PATENT DOCUMENTS 4,356,446 A * 10/1982 Battocletti ........... G01R 21/127
324/140 R
5,796,300 A *  8/1998 Morgan ................. H03F 1/303
330/51
(Continued)

OTHER PUBLICATIONS

Bakker, A. et al: "A CMOS nested-chopper instrumentation amplifier with 100-nV offset", IEEE Journal of Solidstate Circuits, IEEE Service Center, Piscataway, NJ, USA, vol. 35(12): 1877-1883, (Dec. 2000).

(Continued)

*Primary Examiner* — Patricia T Nguyen
(74) *Attorney, Agent, or Firm* — MH2 Technology Law Group LLP

(57) ABSTRACT

In an embodiment an integration circuit has a first input terminal configured to receive a first input signal, a second input terminal configured to receive a second input signal, an output terminal to provide an output signal as a function of the first and the second input signal, a first and a second amplifier, each being switchably connected between the first or the second input terminal and the output terminal, and a capacitor which is switchably coupled in a feedback loop either of the first or of the second amplifier such that the capacitor and one of the first and the second amplifier form an inverting integrator providing the output signal. Therein the integration circuit is prepared to be operated in a first and a second subphase, wherein in each of first and second subphases one of the first and the second input signals is supplied to the inverting integrator and the respective other one of first and the second input signals is supplied to the respective other one of the first and the second amplifier.

19 Claims, 4 Drawing Sheets

(52) U.S. Cl.
CPC .............. *H03F 2203/45174* (2013.01); *H03F 2203/45512* (2013.01); *H03F 2203/45631* (2013.01)

(56) References Cited

U.S. PATENT DOCUMENTS

| | | | |
|---|---|---|---|
| 6,456,159 B1* | 9/2002 | Brewer | H03F 3/393 327/124 |
| 6,476,671 B1 | 11/2002 | Tang | |
| 7,573,327 B1* | 8/2009 | Pertijs | H03F 3/387 327/124 |
| 2012/0229204 A1 | 9/2012 | Han et al. | |
| 2016/0233874 A1* | 8/2016 | Stojanovic | H03M 3/372 |

OTHER PUBLICATIONS

Yi-Hsiang Juan et al.: "A low voltage sigma delta modulator for temperature sensor", Design and Diagnostics of Electronic Circuits & Systems (DDECS), 2012 IEEE 15th International Symposium on, IEEE, pp. 270-273 (Apr. 18, 2012).
European Patent Office, International Search Report for PCT/EP2017/069423, dated Sep. 6, 2017.

* cited by examiner

INTEGRATION CIRCUIT AND METHOD FOR PROVIDING AN OUTPUT SIGNAL

BACKGROUND

The field of the present application concerns an integration circuit or integration stage and a method for providing an output signal.

An integration circuit is a building block often employed in delta sigma analog-to-digital converters. Said delta sigma converters in turn are often used in temperature sensors.

A state of the art integrator circuit as shown in FIG. 5 has an amplifier A with a capacitance C coupled in the amplifier's feedback loop such that amplifier A and capacitance C form an inverting integrator. A first and a second current I1, I2 are alternately supplied to the input of the amplifier A. The amplifier A provides an output signal Vout representing an integration of a current ratio or current difference between the first and the second current I1, I2. While one current is not switched to the input of the amplifier, i.e. while this current is idle, it is switched to a terminal R to which a reference voltage VR is supplied. A parasitic capacitance Cp1, Cp2 builds up at each input which receives the first or the second current I1, I2. Voltage swings across these parasitic capacitances Cp1 and Cp2 lead to charge being injected into the amplifier A, thus distorting the actual current ratio or current difference. Whereas voltage transients across the parasitic capacitance Cp1 at the amplifier's A virtual ground node do not imply charge errors on average, the parasitic capacitances Cp1 and Cp2 each are merely connected to the amplifier A for half a clock cycle of clock signal clk shown on the right side of FIG. 5 and are recharged to the voltage VR of the terminal R during each idle phase. Consequently, during each active phase, i.e. while the respective current I1 or I2 is connected to the input of the amplifier A, a respective charge difference resulting from the difference between the voltage V1, V2 at the input of the respective current and the voltage Vr at the terminal R is injected into the amplifier A. This charge is stored on the respective parasitic capacitance Cp1, Cp2, thereby causing respective error currents. Each error current therein amounts to the quotient of a respective charge difference and a length of the period of the clock signal clk according to the following equations:

$$I1, 2err = \frac{\Delta Q1, 2}{Tclk};$$
$$\Delta Q1, 2 = Cp1, 2 * (VR - V1, 2)$$

Therein, I1,2err denotes the error current of first or second current I1, I2, ΔQ1,2 denotes a difference in charge stored in first or second parasitic capacitance Cp1, Cp2, respectively, Cp1,2 denotes the first or second parasitic capacitance Cp1, Cp2, VR denotes the reference voltage VR and V1,2 denotes the voltage V1 or V2.

Whereas the error charge packages injected into the amplifier A are constant, the input currents I1, I2 are continuous in time, so that the impact on the overall integrated charge depends on the period of the clock signal clk.

Two common solutions exist to address the above-mentioned problem. One possibility is to reduce the frequency of clock signal clk. This reduces the error contribution of the charge packages. However, this increases a total conversion time if this integrator is used e.g. in an analog-to-digital converter. Longer conversion time also implies into higher power consumption.

Another remedy consists in introducing a cascode switching scheme at the sensitive nodes, i.e. the input nodes of the currents I1 and I2, in order to reduce the voltage swing. However, offset between the cascodes still gives rise to residual swing. Moreover, when using the integrator in low supply voltage implementations, there may not be enough headroom for the cascade switches.

SUMMARY

In one embodiment an integration circuit has a first input terminal configured to receive a first input signal, a second input terminal configured to receive a second input signal, an output terminal to provide an output signal as a function of the first and the second input signal, a first and a second amplifier, and a capacitor. Each of first and second amplifiers is switchably connected between the first and the second input terminal and the output terminal. The capacitor is switchably coupled in a feedback loop either of the first or of the second amplifier such that the capacitor and one of the first and the second amplifiers form an inverting integrator providing the output signal. The integration circuit is prepared to be operated in a first and a second subphase. In each of first and second subphases one of the first and the second input signals is supplied to the inverting integrator and the respective other one of first and second input signals is supplied to the respective other one of the first and the second amplifier. Therein the output signal is provided as a function of a time continuous integration of a difference between or a ratio of the first and the second input signal.

For example, in the first subphase the first input signal is supplied to the first amplifier and the second input signal is supplied to the second amplifier. The first amplifier and the capacitor form an inverting integrator and provide the output signal, in this example. Consequently, in the first subphase in this example the output signal is provided as an integration of the first input signal. In the second subphase in this example, the second input signal is supplied to the first amplifier and the first input signal is supplied to the second amplifier. The output signal is consequently provided as a function of an integration of the second input signal. Therefore, during the phase in which an input signal does not contribute to the output signal, i.e. its idle phase, this input signal is switched to the amplifier which does not provide the output signal. By this, the virtual ground voltages of the first and the second amplifiers are matched. The virtual ground at the input of the amplifier which does not provide the output signal exhibits the same swing during the idle phase of this signal as the amplifier which forms the inverting integrator and provides the output signal during the previous active phase of this signal.

Thus, a voltage swing at the first and the second input terminals is greatly reduced. There is no need to increase the supply voltage or to reduce the clock frequency as in state of the art implementations.

In an exemplary embodiment the second amplifier is matched to the first amplifier.

In a development the second input signal is complementary to the first input signal. Therein, first and second input signals each comprise a current signal.

In a further development, each of the first input signal, the second input signal and the output signal is a single-ended signal.

In other words, the signals used in the integration circuit, for example the first input signal, the second input signal and the output signal are not implemented as differential signals, but rather as single-ended signals.

First and second input signals are each realized as a time continuous signal.

In a further development the integration circuit is prepared to be operated in a third and fourth subphase. In each of third and fourth subphases with respect to the first and second subphases, the respective other one of the first and the second amplifier forms the inverting integrator. In each of third and fourth subphases one of the first and the second input signals is supplied to the inverting integrator and the respective other one of the first and the second input signals is supplied to the respective other one of the first and the second amplifiers with respect to the preceding third or fourth subphase.

In an example, in the third subphase, the first input signal is supplied to the first amplifier and the second input signal is supplied to the second amplifier which forms the inverting integrator and provides the output signal. Therefore, in the third subphase the output signal is provided as a function of an integration of the second input signal. In the same example in the fourth subphase the first input signal is supplied to the second amplifier which forms the inverting integrator and the second input signal is supplied to the first amplifier. The output signal in the fourth subphase is provided as a function of an integration of the first input signal.

In the third and fourth subphases the other amplifier forms the inverting integrator with respect to the amplifier which is used in the inverting integrator in the first and second subphases. In the described example, in the first and second subphases the first amplifier forms the inverting integrator and in the third and fourth subphases the second amplifier forms the inverting integrator.

By this swapping of roles of the amplifiers a residual error resulting from mismatch, for example in offset between the first and the second amplifier, is cancelled on average. Consequently, voltage swings which occur in the prior art implementations on the first and the second input terminals are reduced to nearly zero on average. Hence, charge errors are eliminated.

In a further development a transition between the first and the second subphase and vice versa and a transition between the third and the fourth subphase and vice versa is defined by interchanging a connection of the first and the second input terminal to the inverting integrator or the respective other one of the first and the second amplifier with respect to a connection of the first and the second input terminal to the inverting integrator or the respective other one of the first and the second amplifier during a preceding subphase.

When operation of the integration circuit passes over from first to second subphase or from second to first subphase or from third to fourth subphase or from fourth to third subphase the switchable connection between the first and the second input terminal and the first and the second amplifier is swapped or exchanged. Consequently, if in a subphase the first input terminal is coupled to the first amplifier and the second input terminal is coupled to the second amplifier, in the next or subsequent subphase the first input terminal is coupled to the second amplifier and the second input terminal is coupled to the first amplifier.

In a refinement the integration circuit is prepared to be operated during a predefined measurement period which is divided in a first and a second phase. During the first phase of the measurement period a sequence having the first and the second subphases is repeated. During the second phase of the measurement period a sequence having the third and the fourth subphases is repeated.

A length of the measurement period is predefined according to the application in which the integration circuit is used.

In a further development a transition from the first to the second phase is defined by changing over a connection of the capacitor in the feedback loop of the first or of the second amplifier from the first to the second amplifier or vice versa such that with respect to the preceding first or second phase the other amplifier and the capacitor form the inverting integrator.

This means that if during the first phase of the measurement period the first amplifier together with the capacitor form the inverting integrator, the connection of the capacitor is changed over to the second amplifier such that in the following or subsequent second phase of the measurement period the second amplifier together with the capacitor form the inverting integrator.

Consequently, the role of forming the inverting integrator is exchanged once during the predefined measurement period from first to second amplifier or vice versa.

In a refinement the changing over of the connection of the capacitor is effected such that in the first phase the first amplifier and the capacitor form the inverting integrator which is prepared to provide the output signal and in the second phase the second amplifier and the capacitor form the inverting integrator or vice versa.

In a further development the first amplifier has an inverting input terminal which is switchably connected either to the first or to the second input terminal as a function of the first, the second, the third and the fourth subphase. The first amplifier further has a non-inverting input terminal which receives a reference signal. The second amplifier has an inverting input terminal which is switchably connected either to the first or to the second input terminal as a function of the first, the second, the third and the fourth subphase. The second amplifier further has a non-inverting input terminal which receives the reference signal.

The reference signal is represented for instance by a reference voltage. Said reference voltage is dimensioned such that the integration circuit works at the correct operating point. For example, the reference voltage amounts to half of a supply voltage of the integration circuit.

In a further development the feedback loop of the first amplifier extends between an output of the first amplifier and its inverting input terminal. The feedback loop of the second amplifier extends between an output of the second amplifier and its inverting input terminal.

In a refinement the amplifier which does not form the inverting integrator in a respective subphase is configured in unity feedback forming a dummy amplifier.

The amplifier forming the dummy amplifier is configured in full series feedback by connecting its output to its negative input terminal. This amplifier can also be denoted as a voltage follower. The dummy amplifier can also be called a "replica amplifier". The amplifier forming the inverting integrator and the dummy amplifier are always connected to one of the input terminals.

In one embodiment a delta sigma converter has an integration circuit as described above and a comparator circuit which is coupled to the output terminal of the integration circuit. The comparator circuit is prepared to provide a comparator signal as a function of comparison of the output signal of the integration circuit with a threshold signal.

Due to the fact that first and second input terminals are complementary to each other, each of them representing for instance a current, the output signal, e.g. a voltage, at the output terminal of the integration circuit increases and decreases linearly in a triangular form. The threshold signal is chosen such that it is approximately in the middle between maximum and minimum value of the output signal. Consequently, the comparator signal changes its value each time the output signal of the integration circuit assumes the value of the threshold signal.

In an exemplary embodiment the delta sigma converter as described above is used in a temperature sensor.

The temperature sensor is for instance implemented as a current domain temperature to digital converter. Therein a frontend of the temperature sensor, which may be implemented in bipolar technology, generates a first current proportional to absolute temperature and a second current which is complementary to absolute temperature. These two currents are used as first and second input signals for the integration circuit of the delta sigma converter. A digital pulse modulated signal is provided by the integration circuit containing the information about a ratio between absolute temperature and complementary temperature. Said signal is passed through digital post processing and finally represents the temperature in a digital form.

By using the integration circuit as described above, faster switching is possible when compared to state of the art integrators which decreases the time needed for conversion of the temperature.

In one embodiment a method for providing an output signal has the following steps:

in a first subphase feeding a first input signal to a first amplifier forming an inverting integrator, feeding a second input signal to a second amplifier forming a dummy amplifier and providing an output signal by integrating the first input signal, and in a second subphase feeding the first input signal to the second amplifier forming the dummy amplifier, feeding the second input signal to the first amplifier forming the inverting integrator and providing the output signal by integrating the second input signal, therein the dummy amplifier is configured in unity feedback, and the output signal is provided as a function of a time continuous integration of a difference between or a ratio of the first and the second input signal.

During the first and the second subphases the first amplifier forms the inverting integrator which provides the output signal and the second amplifier forms the dummy amplifier. Consequently, first and second input signals are switched from the first to the second amplifier and vice versa. By this, an occurrence of error currents is greatly reduced.

In a development the method further comprises the following steps:

in a third subphase feeding the first input signal to the first amplifier forming the dummy amplifier, feeding the second input signal to the second amplifier forming the inverting integrator and providing the output signal by integrating the second input signal, and in a fourth subphase feeding the first input signal to the second amplifier forming the inverting integrator, feeding the second input signal to the first amplifier forming the dummy amplifier and providing the output signal by integrating the first input signal.

Therein, first and second subphases are repeated during a first phase of a predefined measurement period. Third and fourth subphases are repeated during a second phase of the predefined measurement period.

The method can be implemented in the integration circuit described above, for example.

BRIEF DESCRIPTION OF THE DRAWINGS

The text below explains the proposed integration circuit and corresponding method in detail using exemplary embodiments with reference to the drawings. Components and circuit elements that are functionally identical or have the identical effect bear identical reference numbers. In so far as circuit parts or components correspond to one another in function, a description of them will not be repeated in each of the following figures.

FIG. 5 shows an integrator circuit including an amplifier A with a capacitance C coupled in the amplifier's feedback loop such that amplifier A and capacitance C form an inverting integrator.

DETAILED DESCRIPTION

Figure 1:
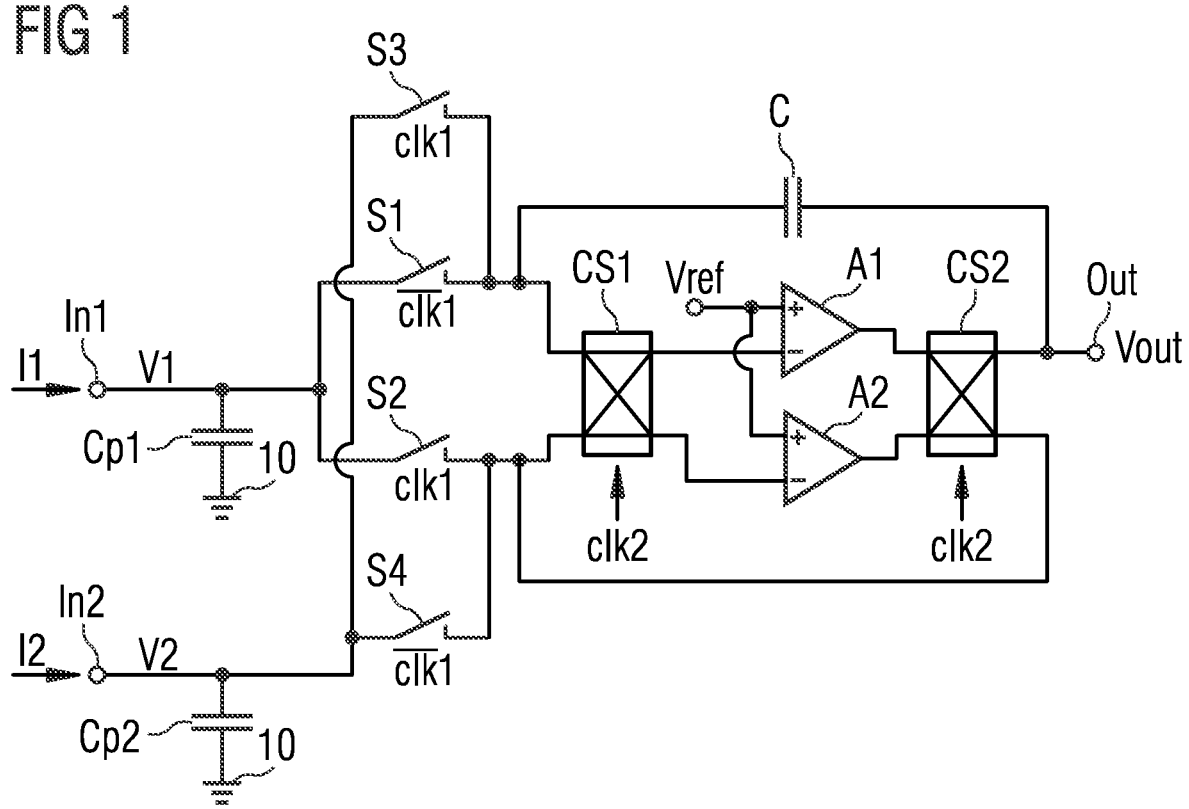
FIG. 1 shows an embodiment example of the proposed integration circuit.

FIG. 1 shows an embodiment example of the proposed integration circuit. The integration circuit has a first and a second input terminal In1, In2, a first amplifier A1, a second amplifier A2, a capacitor C and an output terminal Out. The first input terminal In1 is configured to receive a first input signal I1 which comprises, for example, a first input current. The second input terminal In2 is configured to receive a second input signal I2 which comprises, for instance, a second input current. The first amplifier A1 is switchably connected between the first and the second input terminal In1, In2 and the output terminal Out. The second amplifier A2 is switchably connected between the first and the second input terminal In1, In2 and the output terminal Out. In detail, the first input terminal In1 is switchably connected to an inverting input terminal of the first amplifier A1 by a first switch S1. The first input terminal In1 is further switchably connected to an inverting input terminal of the second amplifier A2 by means of a second switch S2. The second input terminal In2 is switchably connected to the inverting input of the first amplifier A1 by a third switch S3. The second input terminal In2 is further coupled to the inverting input of the second amplifier A2 by means of a fourth switch S4.

The capacitor C is switchably coupled in a feedback loop either of the first amplifier A1 or of the second amplifier A2 by means of a first chopping switch CS1 and a second chopping switch CS2. The amplifier out of first and second amplifiers A1, A2 which has the capacitor C switched into its feedback loop by means of chopping switches CS1 and CS2 forms an inverting integrator. The respective other amplifier out of first and second amplifiers A1, A2 is configured in unity feedback with its output being connected to its inverting input by means of chopping switches CS1, CS2 thereby forming a dummy or replica amplifier. An output of the amplifier out of first and second amplifiers A1, A2 which forms the inverting integrator is switched to the output terminal Out of the integration circuit by means of the second chopping switch CS2 for providing the output signal Out. The first and the second chopping switch CS1, CS2 are concurrently controlled by a second clock signal clk2.

A chopping switch is also called a swapping switch, implementation of which is known to those skilled in the art.

First, second, third and fourth switches S1, S2, S3, S4 are controlled by a first clock signal clk1 and the inverted first clock signal $\overline{clk1}$. In detail, the second and the third switch S2, S3 are controlled by the first clock signal clk1, whereas the first and the fourth switch S1, S4 are controlled by the inverted first clock signal $\overline{clk1}$.

The non-inverting inputs of the first and the second amplifiers A1, A2 each receive a reference signal Vref.

FIG. 1 also shows parasitic capacitances which build up at the input terminals In1, In2. Namely, a first parasitic capacitance Cp1 builds up at the first input terminal In1 with respect to a reference potential terminal 10. Similarly, at the second input terminal In2 a second parasitic capacitance Cp2 builds up with reference to the reference potential terminal 10. Operation of the integration circuit will be described below with reference to FIG. 2 and FIGS. 3A to 3D.

Figure 2:
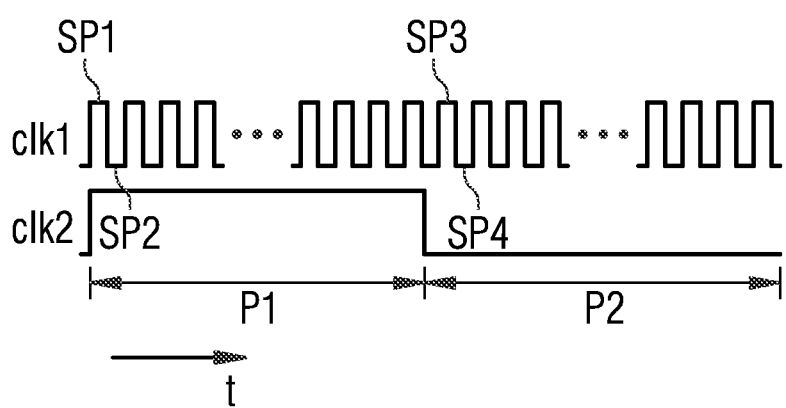
FIG. 2 shows an exemplary timing diagram for the proposed integration circuit.

FIG. 2 shows an exemplary timing diagram for the proposed integration circuit. The first and the second clock signals clk1, clk2 are depicted with respect to time t. A measurement period of the integration circuit is made up of two phases, namely a first phase P1 and a second P2. First and second phases P1, P2 are determined by the second clock signal clk2. The first phase P1 further has a number of first and second subphases SP1, SP2 determined by the first clock signal clk1. The second phase P2 has a number of third and fourth subphases SP3, SP4 which also are determined by the first clock signal clk1.

Figure 3A:
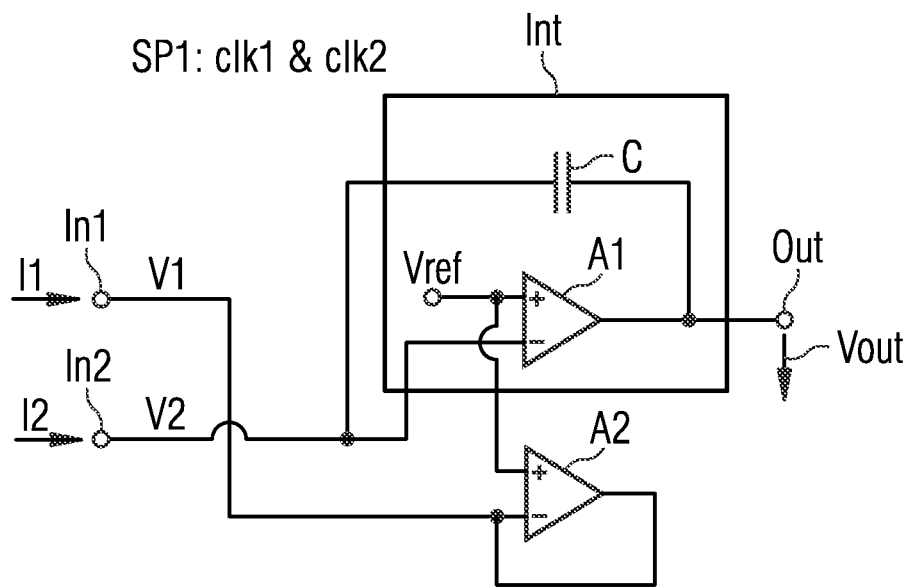
FIG. 3A shows an embodiment example of the proposed integration circuit during the first subphase.

FIG. 3A shows an embodiment example of the proposed integration circuit during the first subphase. During the first subphase SP1 as of FIG. 2 the first amplifier A1 is configured as inverting integrator Int, whereas the second amplifier A2 forms a dummy amplifier. Under control of the first clock signal clk1, the second and the third switches S2, S3 are closed, whereas the first and the fourth switches S1, S4 are opened. Consequently, the second input signal I2 is provided to the inverting integrator Int and the first input signal I1 is provided to the dummy amplifier A2. The output signal Vout is provided as an integration of the second input signal In1. A first voltage V1 drops at the first input terminal In1. A second voltage V2 drops at the second input terminal In2.

Figure 3B:
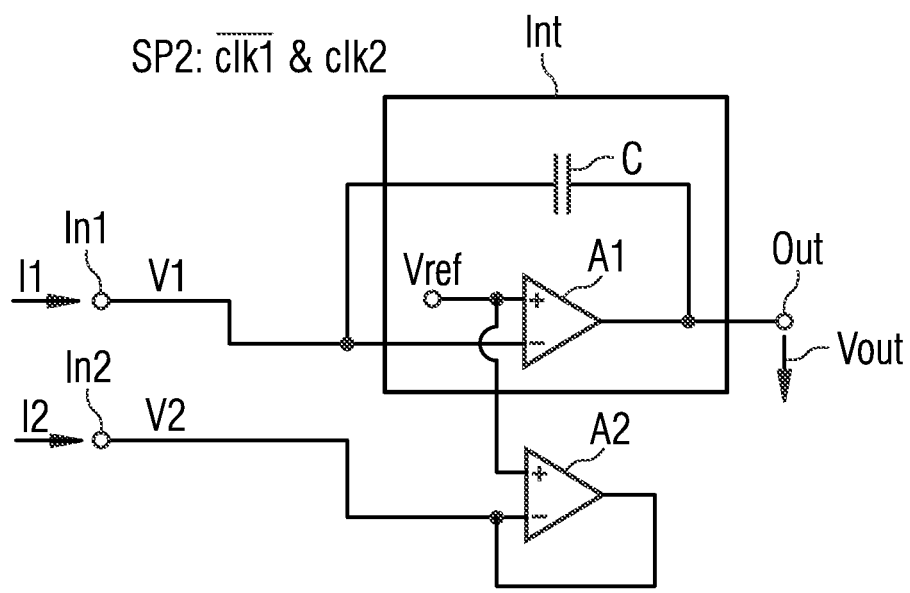
FIG. 3B shows an embodiment example of the proposed integration circuit during the second subphase.

FIG. 3B shows an embodiment example of the proposed integration circuit during the second subphase. The first amplifier A1 continues to form the inverting integrator Int together with the capacitor C. Under control of the first clock signal clk1 first and fourth switches S1, S4 are closed and second and third switches S2, S3 are opened. Consequently, the first input signal I1 is supplied to the inverting integrator Int. The second input signal I2 is supplied to the dummy amplifier A2. The output signal Vout is provided as a function of an integration of the first input signal I1.

It can be seen that instead of switching one of the input terminals In1, In2 which is currently not used for integration, i.e. it is idle, to a reference potential terminal as in state of the art implementations described in the opening part of this application, according to the proposed integration circuit the input terminal whose input signal is not currently integrated is switched to the dummy amplifier. Because of a matching between the first and the second amplifiers A1, A2 and consequently matched virtual ground voltages, a voltage swing at the input terminals In1, In2 is greatly reduced.

There is no need to increase a supply voltage nor to decrease a frequency of the first clock signal clk1. The proposed integration circuit can be operated with a clock frequency of approximately 1 MHz, for example.

A voltage swing at an input node therein denotes the difference in voltage at this node which occurs when switching over from the first subphase SP1 to the second subphase SP2 and vice versa.

Figure 3C:
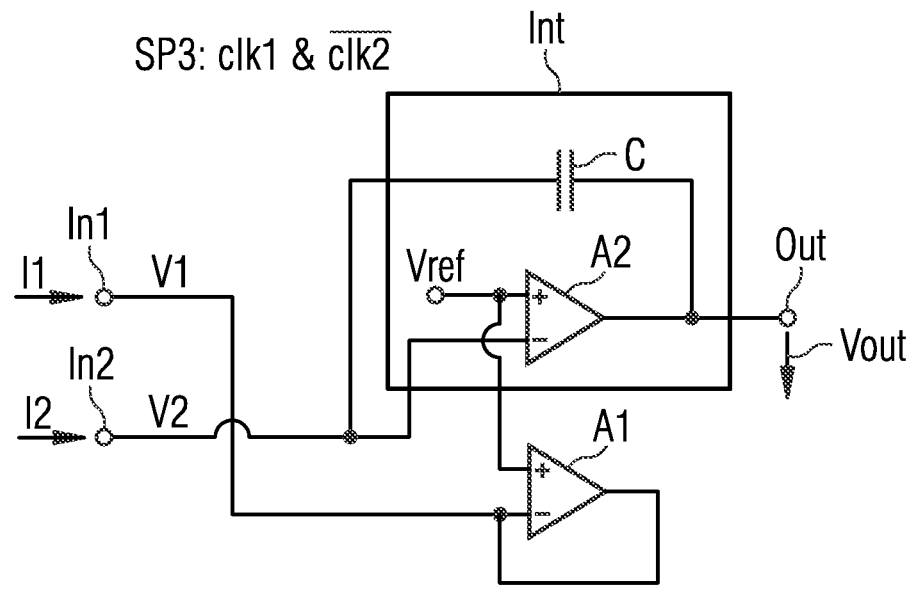
FIG. 3C shows an embodiment example of the proposed integration circuit during the third subphase.

FIG. 3C shows an embodiment example of the proposed integration circuit during the third subphase SP3. Under control of the second clock signal clk2 the integration circuit is operated in the second phase P2 according to FIG. 2 and the roles of inverting integrator and dummy amplifier are swapped between first and second amplifier A1, A2 using the chopping switches CS1, CS2 of FIG. 1. Consequently, during the third subphase SP3 the second amplifier A2 forms the inverting integrator Int together with the capacitor C and provides the output signal Vout. The first amplifier A1 forms the dummy amplifier configured in unity feedback. Under control of the first clock signal clk1 the switches are operated such that the first input signal I1 is supplied to the dummy amplifier A1 and the second input signal I2 is provided to the inverting integrator Int. The output signal Vout is provided in function of an integration of the second input signal I2. Therein, $\overline{clk2}$ represents the inverted second clock signal clk2.

Figure 3D:
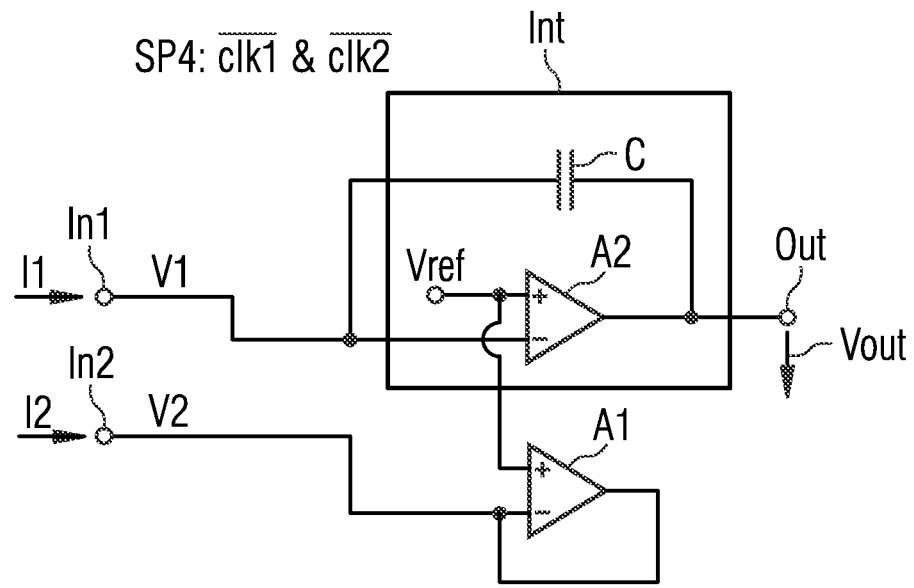
FIG. 3D shows an embodiment example of the proposed integration circuit during the fourth subphase.

FIG. 3D shows an embodiment example of the proposed integration circuit during the fourth subphase. In the fourth subphase SP4 as of FIG. 2 the second amplifier A2 continues to form the inverting integrator Int. Under control of the first clock signal clk1, the first input signal In1 is supplied to the inverting integrator Int and the second input signal I2 is supplied to the dummy amplifier A1. The output signal Vout is provided as a function of an integration of the first input signal I1.

It can be seen that during switchover from the third to the fourth subphase SP3, SP4 the input signals of first and second amplifiers A1, A2 are swapped. Thereby a voltage swing across the parasitic capacitances Cp1, Cp2 of FIG. 1 is greatly reduced. Furthermore, by swapping the roles of inverting integrator Int and dummy amplifier between first and second amplifiers A1, A2 when switching over from the first phase P1 to the second phase P2 in the operation of the integration circuit, a residual swing which is caused by mismatch of the operational amplifiers and potential differences in offsets is further reduced. This residual error is cancelled on average.

Figure 4:
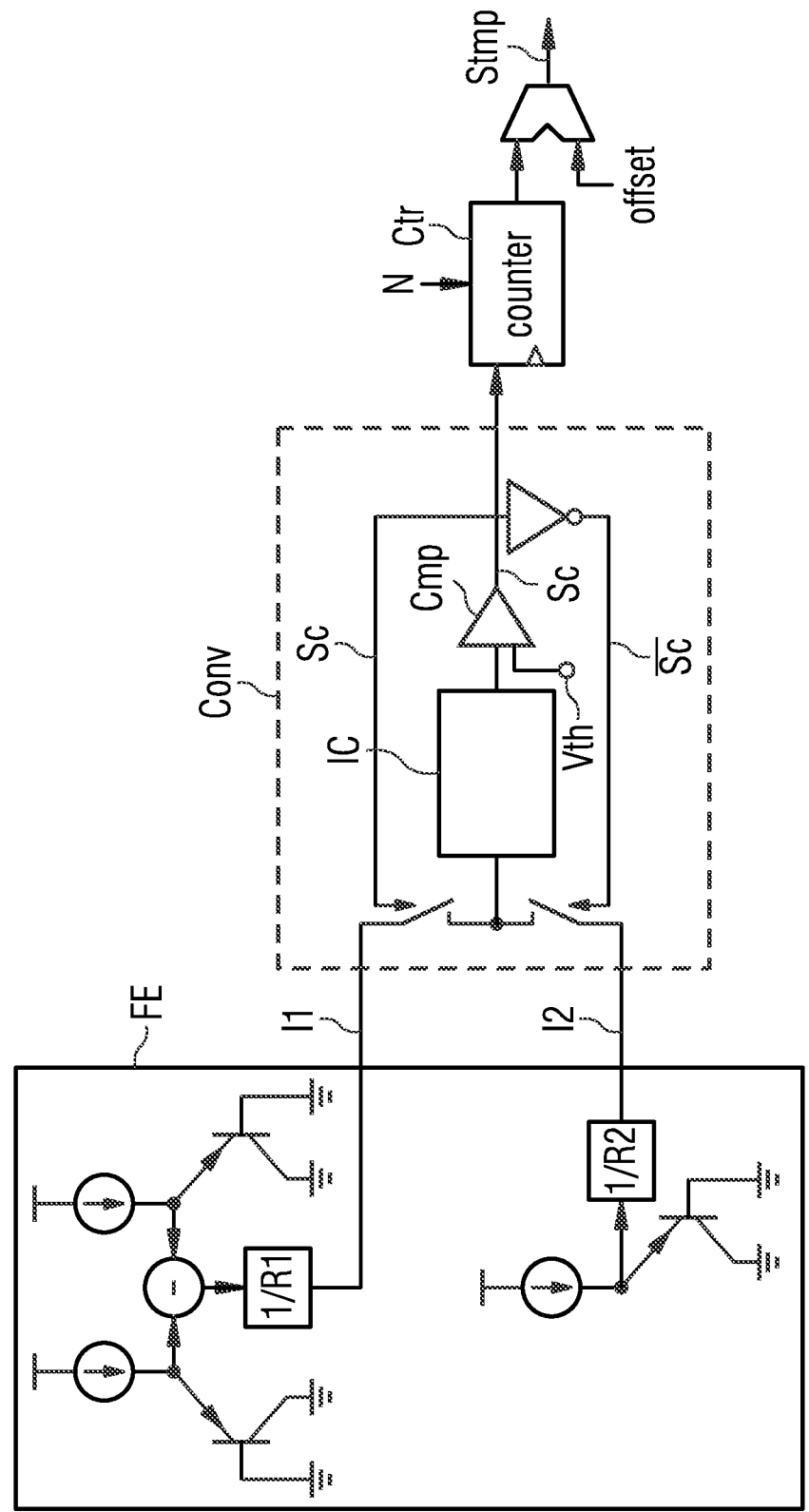
FIG. 4 shows a temperature sensor having a delta sigma converter as proposed.

FIG. 4 shows a temperature sensor having a delta sigma converter as proposed. The delta sigma converter Conv has an integration circuit IC as proposed and described above and a comparator circuit Cmp which is coupled to the output of the integration circuit IC. The comparator circuit Cmp compares the output signal Vout of the integration circuit IC to a threshold signal Vth and therefrom provides a comparison signal Sc.

The comparison signal Sc is provided to a counter component Ctr which provides a number of zero crossings of the comparison signal Sc. After some further filtering a temperature signal Stmp is provided.

When the delta sigma converter Conv is used in a temperature sensor a bipolar frontend FE is applied to provide the first and the second input signals I1, I2 as is known to those skilled in the art.

The bipolar frontend FE has a proportional to absolute temperature, PTAT, sensor which provides the first input signal I1 in the form of the first input current. The bipolar frontend further has a complementary to absolute temperature, CTAT, sensor which provides the second input signal I2 in the form of the second input current. The integration circuit IC within the delta sigma converter Conv provides a digital pulse modulated signal that represents the ratio of first to second input signal I1, I2 in the form of the comparison signal Sc. After applying digital post-processing in the form of the counter Ctr, the measured temperature is digitally represented in the temperature signal Stmp.

It is to be understood that any feature described in relation to any one embodiment may be used alone, or in combination with other features described, and may also be used in combination with one or more features of any other of the embodiments, or any combination of any other of the embodiments unless described as alternative. Furthermore, equivalents and modifications not described above may also be employed without departing from the scope of the integration circuit and method which are defined in the accompanying claims.

REFERENCE LIST 10 reference potential terminal
In1, In2, Out input/output terminal
I1, I2, Vout, Vref, Vth signal
V1, V2, VR voltage
A1, A2, A amplifier
S1, S2, S3, S4 switch
CS1, CS2 switch
Int inverting integrator
C capacitor
clk1, $\overline{clk1}$, clk2, $\overline{clk2}$ clock signal
Cp1, Cp2, Cpi parasitic capacitance
SP1, SP2, SP3, SP4 subphase
P1, P2 phase
IC integration circuit
Conv delta sigma converter
Sc, Stmp signal
Ctr counter
Cmp comparator
Inv inverter
FE front end

I claim:

1. An integration circuit comprising:
a first input terminal configured to receive a first input signal,
a second input terminal configured to receive a second input signal,
an output terminal configured to provide an output signal as a function of the first input signal and the second input signal,
a first amplifier and a second amplifier, each being switchably connected between either the first input terminal or the second input terminal and the output terminal, and
a capacitor that is switchably coupled in a feedback loop either of the first amplifier or of the second amplifier such that the capacitor and one of the first amplifier or the second amplifier form an inverting integrator that provides the output signal,
wherein the integration circuit is configured to be operated in a first subphase and in a second subphase, wherein in each of the first subphase and the second subphase, one of the first input signal or the second input signal is supplied to the inverting integrator and a respective other one of the first input signal or the second input signal is supplied to a respective other one of the first amplifier or the second amplifier,
wherein the output signal is provided as a function of a time continuous integration of (i) a difference between the first input signal and the second input signal or (ii) a ratio of the first input signal and the second input signal, and
wherein the amplifier that does not form the inverting integrator in the respective subphase is configured in unity feedback forming a dummy amplifier.

2. The integration circuit according to claim 1, wherein the second input signal is complementary to the first input signal, and wherein each of the first input signal and the second input signal comprises a respective current signal.

3. The integration circuit according to claim 1, wherein each of the first input signal, the second input signal and the output signal is a respective single-ended signal.

4. The integration circuit according to claim 1, wherein the integration circuit is configured to be operated in a third subphase and in a fourth subphase, wherein in each of the third subphase and fourth subphase with respect to the first subphase and the second subphase, the respective other one of the first amplifier or the second amplifier forms the inverting integrator, and wherein in each of the third subphase and the fourth subphase, one of the first input signal or the second input signal is supplied to the inverting integrator and the respective other one of the first input signal or the second input signal is supplied to the respective other one of the first amplifier or the second amplifier with respect to the preceding third subphase or the preceding fourth subphase.

5. The integration circuit according to claim 4, wherein a transition between the first subphase and the second subphase and vice versa and a transition between the third subphase and the fourth subphase and vice versa is defined by interchanging a connection of the first terminal and the second input terminal to the inverting integrator or the respective other one of the first amplifier or the second amplifier with respect to a connection of the first input terminal and the second input terminal to the inverting integrator or the respective other one of the first amplifier or the second amplifier during a preceding subphase.

6. The integration circuit according to claim 4, wherein the integration circuit is configured to be operated during a predefined measurement period that is divided into a first phase and a second phase, wherein during the first phase of the measurement period a sequence having the first subphase and the second subphase is repeated, and wherein during the second phase of the predefined measurement period a sequence having the third subphase and the fourth subphase is repeated.

7. The integration circuit according to claim 6, wherein:
a transition from the first phase to the second phase is defined by changing over a connection of the capacitor in the feedback loop of the first amplifier or of the second amplifier from the first amplifier to the second amplifier or vice versa such that with respect to the preceding first phase or the preceding second phase the other amplifier and the capacitor form the inverting integrator.

8. The integration circuit according to claim 7, wherein:
the changing over the connection of the capacitor is effected such that in the first phase the first amplifier and the capacitor form the inverting integrator and such that in the second phase the second amplifier and the capacitor form the inverting integrator or vice versa.

9. The integration circuit according to claim 4, wherein:
the first amplifier comprises an inverting input terminal that is switchably connected either to the first input terminal or to the second input terminal as a function of the first subphase, the second subphase, the third subphase and the fourth subphase, and a non-inverting input terminal that is configured to receive a reference signal, and
the second amplifier comprises an inverting input terminal that is switchably connected either to the first input terminal or to the second input terminal as a function of the first subphase, the second subphase, the third subphase, and the fourth subphase, and a non-inverting input terminal that is configured to receive the reference signal.

10. The integration circuit according to claim 8,
wherein the feedback loop of the first amplifier extends between an output of the first amplifier and its inverting input terminal, and
wherein the feedback loop of the second amplifier extends between an output of the second amplifier and its inverting input terminal.

11. Delta sigma converter, comprising:
an integration circuit according to claim 1,
a comparator circuit that is coupled to the output terminal of the integration circuit, the comparator circuit being configured to provide a comparator signal as a function of a comparison of the output signal of the integration circuit with a threshold signal.

12. A temperature sensor having a delta sigma converter according to claim 11.

13. A method for providing an output signal, the method comprising:
in a first subphase:
feeding a first input signal to a first amplifier forming an inverting integrator,
feeding a second input signal to a second amplifier forming a dummy amplifier, and
providing an output signal by integrating the first input signal, and in a second subphase:
feeding the first input signal to the second amplifier forming the dummy amplifier,
feeding the second input signal to the first amplifier forming the inverting integrator, and
providing the output signal by integrating the second input signal,
wherein the dummy amplifier is configured in unity feedback, and
wherein the output signal is provided as a function of a time continuous integration of a difference between the first input signal and the second input signal or (ii) a ratio of the first input signal and the second input signal.

14. The method according to claim 13, further comprising:
in a third subphase:
feeding the first input signal to the first amplifier forming the dummy amplifier,
feeding the second input signal to the second amplifier forming the inverting integrator, and
providing the output signal by integrating the second input signal, and in a fourth subphase:
feeding the first input signal to the second amplifier forming the inverting integrator,
feeding the second input signal to the first amplifier forming the dummy amplifier, and
providing the output signal by integrating the first input signal,
wherein:
the first subphase and the second subphase are repeated during a first phase of a predefined measurement period, and
the third subphase and the fourth subphase are repeated during a second phase of the predefined measurement period.

15. The integration circuit according to claim 1,
wherein each of the first input signal, the second input signal and the output signal is a respective single-ended signal, and wherein the integration circuit is configured to be operated in a third subphase and in a fourth subphase,
wherein in each of the third subphase and the fourth subphase with respect to the first subphase and the second subphase, the respective other one of the first amplifier or the second amplifier forms the inverting integrator, and
wherein in each of the third subphase and the fourth subphase, one of the first signal or the second input signal is supplied to the inverting integrator and the respective other one of the first input signal or the second input signal is supplied to the respective other one of the first amplifier or the second amplifier with respect to the preceding third subphase or the preceding fourth subphase.

16. The integration circuit according to claim 15,
wherein a transition between the first subphase and the second subphase and vice versa and a transition between the third subphase and the fourth subphase and vice versa is defined by interchanging a connection of the first input terminal and the second input terminal to the inverting integrator or the respective other one of the first amplifier or the second amplifier with respect to a connection of the first input terminal and the second input terminal to the inverting integrator or the respective other one of the first amplifier or the second amplifier during a preceding subphase.

17. The integration circuit according to claim 16, wherein:
the integration circuit is configured to be operated during a predefined measurement period that is divided into a first phrase and a second phase, wherein during the first phase of the measurement period a sequence having the first subphase and the second subphase is repeated, and wherein during the second phase of the predefined measurement period a sequence having the third subphase and the fourth subphase is repeated.

18. The integration circuit according to claim 17, wherein:
a transition from the first phase to the second phase is defined by changing over a connection of the capacitor in the feedback loop of the first amplifier or of the second amplifier from the first amplifier to the second amplifier or vice versa such that with respect to the preceding first phase or the preceding second phase the other amplifier and the capacitor form the inverting integrator.

19. The integration circuit according to claim 18, wherein:
the changing over the connection of the capacitor is effected such that in the first phase the first amplifier and the capacitor form the inverting integrator and in the second phase the second amplifier and the capacitor form the inverting integrator or vice versa.

\* \* \* \* \*